United States Patent
Gau et al.

(10) Patent No.: US 6,187,629 B1
(45) Date of Patent: Feb. 13, 2001

(54) METHOD OF FABRICATING A DRAM CAPACITOR

(75) Inventors: Jing-Horng Gau, Nan-Tou Hsien; Hsiu-Wen Huang, Kaoshiung; Jhy-Jyi Sze, Tainan, all of (TW)

(73) Assignee: United Semiconductor Corp., Hsinchu (TW)

( * ) Notice: Under 35 U.S.C. 154(b), the term of this patent shall be extended for 0 days.

(21) Appl. No.: 09/206,109

(22) Filed: Dec. 4, 1998

(30) Foreign Application Priority Data

Sep. 18, 1998 (TW) ................................................ 87115563

(51) Int. Cl.$^7$ .............................................. H01L 21/8242
(52) U.S. Cl. .......................... 438/255; 438/253; 438/396; 438/398
(58) Field of Search ..................................... 438/253, 255, 438/396, 398, FOR 212, FOR 430; 148/DIG. 14

(56) References Cited

U.S. PATENT DOCUMENTS 5,684,331 * 11/1997 Jun .

* cited by examiner

Primary Examiner—George Fourson
Assistant Examiner—Barbara Elizabeth Abbott
(74) Attorney, Agent, or Firm—J. C. Patents; Jiawei Huang

(57) ABSTRACT

A method of fabricating a DRAM capacitor. A conductive layer and an amorphous silicon layer are formed on a substrate having a dielectric layer. The amorphous silicon layer and the conductive layer are etched to form a region of a capacitor to expose a portion of the dielectric layer. An opening with a profile having a wider upper portion and a narrower lower portion is formed within the conductive layer, and through the opening, the dielectric layer is then etched through to form a node contact window to expose the substrate. An amorphous silicon spacer is formed on the sidewall of conductive layer of the region of the capacitor and fills the node contact window. A selective HSG-Si, a dielectric layer and a polysilicon layer are formed to achieve the fabrication of the capacitor. The conductive layer, the amorphous silicon layer and the HSG-Si serve as a lower electrode of the capacitor and the polysilicon layer serves as an upper electrode of the capacitor.

8 Claims, 5 Drawing Sheets

METHOD OF FABRICATING A DRAM CAPACITOR

CROSS-REFERENCE TO RELATED APPLICATION

This application claims priority benefit of Taiwan application Ser. No. 87115563, filed Sep. 18, 1998, the full disclosure of which is incorporated herein by reference.

BACKGROUND OF THE INVENTION

1. Field of the Invention

The invention relates to a method of fabricating an integrated circuit, and more particularly to a method of fabricating a dynamic random access memory (DRAM) capacitor.

2. Description of the Related Art

FIG. 1 is a memory cell of a DRAM device including a transfer transistor T and a storage capacitor C. The source region of the transfer transistor T is coupled to a corresponding bit line BL, the drain region is coupled to a storage capacitor 100 of the storage capacitor C and the gate electrode is coupled to a corresponding word line WL. An opposite electrode 102 of the storage capacitor C is coupled to a fixed voltage. A dielectric layer 104 is situated between the storage electrode 100 and the opposite electrode 102.

A schematic, cross-sectional view of a conventional DRAM capacitor is shown in FIG. 2. Isolation structures and word lines (not shown) are formed on a substrate 200 and word lines are isolated with the bit lines 204 by dielectric layers 202a, 202b formed on the substrate 200. A node contact window 205 is formed within the dielectric layer 202a, 202b and a polysilicon layer is deposited in the node contact window 205. The polysilicon layer is then patterned by photolithography to form a lower electrode 206 of a capacitor.

Since the design rule for semiconductors is reduced, the width for exposure and alignment of the node contact window 205 becomes narrower. The width of the node contact window 205 is also restricted by the resolution of the exposure light source, so that it is necessary to reduce the size of the node contact window 205.

A selective HSG-Si 208 is always deposited on the lower electrode 206 to increase the surface area of the lower electrode 206. In order to form the selective HSG-Si, an amorphous silicon layer needs to be formed as a substitute for the polysilicon layer 206 and to serve as the lower electrode of the capacitor. But the deposition rate of the amorphous silicon layer is slower than that of the polysilicon layer, such that the throughput of the product is reduced and the demands for product competition can not be satisfied.

SUMMARY OF THE INVENTION

It is therefore an object of the invention to increase the available exposure range of the node contact window to reduce misalignment error, and so that the width of the node contact window can be reduced.

It is therefore another object of the invention to decrease the thickness of the amorphous silicon layer and still increase the surface area of the lower electrode, so that the cost of the product can be reduced and the yield is improved.

To achieve these objects and advantages, and in accordance with the purpose of the invention, as embodied and broadly described herein, the invention is directed towards a method of fabricating a DRAM capacitor. A conductive layer and an amorphous silicon layer are formed on a substrate having a dielectric layer. The amorphous silicon layer and the conductive layer are etched to form a region of a capacitor to expose a portion of the dielectric layer. An opening with a profile having a wider upper portion and narrow lower portion is formed within the conductive layer, and through the opening, the dielectric layer is then etched through to form a node contact window to expose the substrate. An amorphous silicon spacer is formed on the sidewall of the conductive layer in the region of the capacitor and fills the node contact window. A selective HSG-Si, a dielectric layer and a polysilicon layer are formed to complete capacitor fabrication. The conductive layer, the amorphous silicon layer and the HSG-Si serve as a lower electrode of the capacitor and the polysilicon layer serves as an upper electrode of the capacitor.

It is to be understood that both the foregoing general description and the following detailed description are exemplary and explanatory only and are not restrictive of the invention, as claimed.

DESCRIPTION OF THE PREFERRED EMBODIMENTS

Defining a node contact window first, depositing a polysilicon layer to fill the contact window and patterning the polysilicon layer to form a lower electrode of the capacitor is a normal process for fabricating a DRAM capacitor. When the size of the semiconductor is reduced the definition and alignment process to form the node contact window is difficult. If an amorphous silicon layer serves as a lower electrode of the capacitor, the throughput of the product is decreased due to larger deposition range and lower deposition rate of the amorphous silicon layer. Therefore, a capacitor fabricating method is provided to enlarge the exposure range of the node contact window and reduce the width of the node contact window. The desired amorphous silicon layer becomes thinner and the throughput can thus be enhanced. FIGS. 3A–3G show schematic, cross-sectional views of the preferred embodiment of this invention.

Figure 3A:
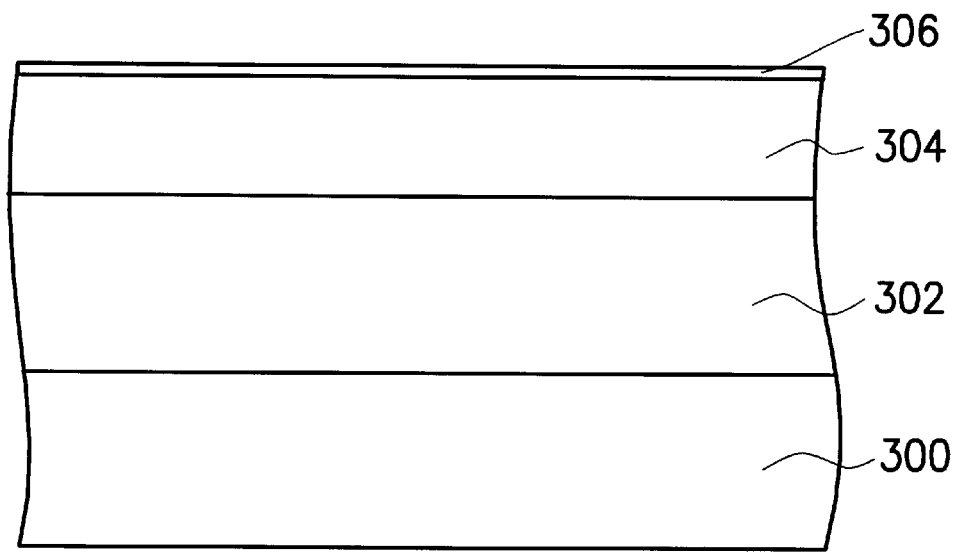
FIGS. 3A–3G are schematic, cross-sectional views illustrating fabrication of DRAM in a preferred embodiment according to the invention.

Referring to FIG. 3A, isolation structures, word lines and bit lines (not shown) are formed on a substrate 300 and an inter-poly dielectric (IPD) layer 302 is deposited to cover the structure as described above. Word lines and bit lines are isolated by the IPD 302 and the IPD 302 includes a silicon oxide layer. A conductive layer 304 is formed by chemical vapor deposition on the IPD 302. The conductive layer 304 includes a polysilicon layer and it is doped with impurities to improve its conductivity. The thickness of the conductive layer 304 is determined by the dimension of the desired capacitor. An amorphous silicon layer 306 is formed on the conductive layer 304 by low pressure chemical vapor deposition (LPCVD).

Figure 3B:
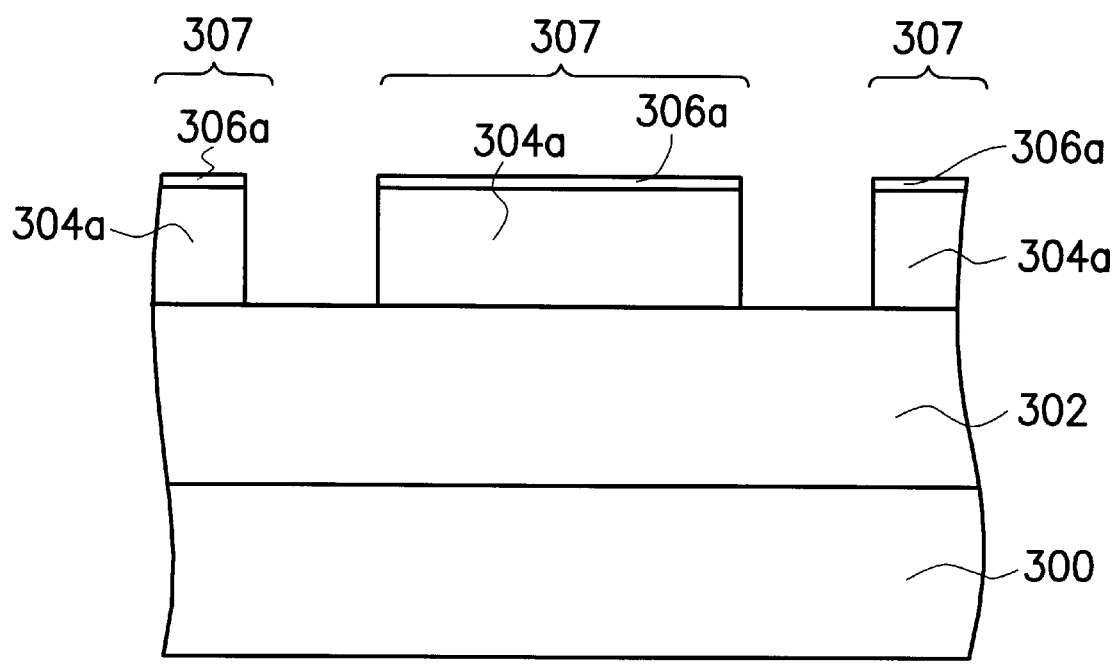

Using photolithography to pattern the amorphous silicon layer 306 and the conductive layer 304, a portion of the amorphous silicon layer 306 and the conductive layer 304 are removed to define a region 307 for capacitor. A part of the IPD 302 is therefore exposed, and the remaining amorphous silicon layer 306a and conductive layer 304a form a region 307 intended to be a capacitor, as shown in FIG. 3B.

Figure 3C:
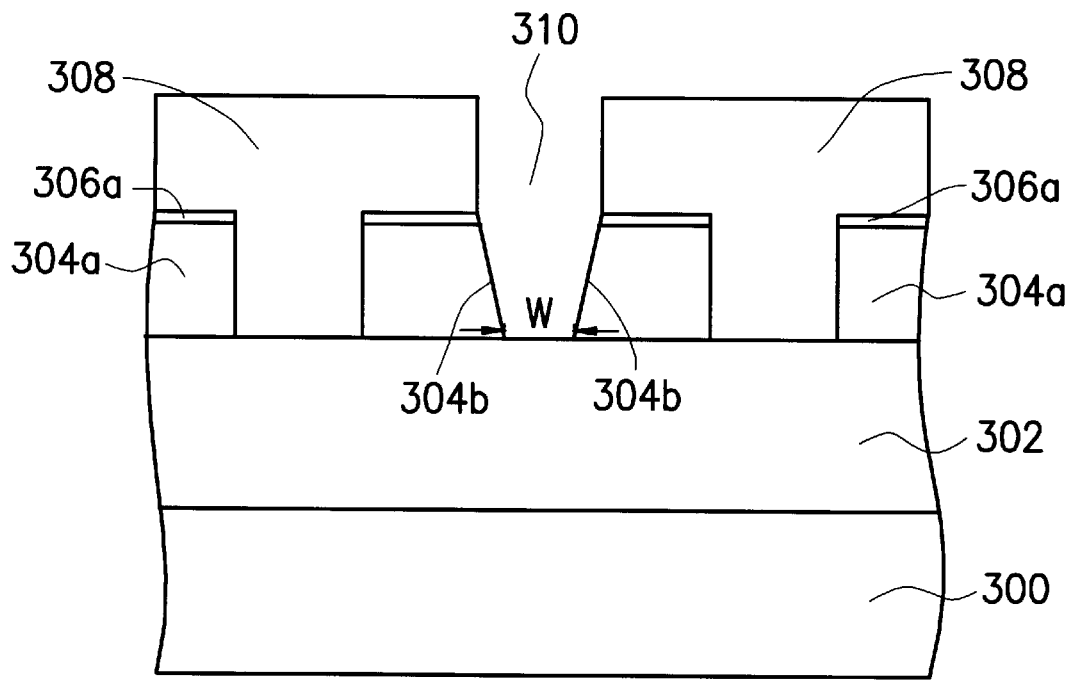

Referring to FIG. 3C, a photoresist layer 308 is coated on the conductive layer 304a and the amorphous silicon layer 306a, and an opening 310 is formed within the conductive layer 304a by patterning the amorphous silicon layer 306a and the conductive layer 304a. The opening 310 has a profile with a wider upper portion and a narrower lower portion. The width w of the lower portion of the opening 310 is decided by the size of the node contact window subsequently formed. In order to expand the range of the depth of focus to simplify the process, the photoresist layer 308 to pattern the conductive layer 304a is over-exposed, meaning that the exposure range is larger than that pre-determined, to obtain a wider opening within the photoresist layer 308. The opening 310 with wider upper portion and narrower lower portion comes from adjusting the etching gas recipe for etching the conductive layer 304a. Polymer is formed and gradually covers the exposed sidewall 304b of the conductive layer 304a to protect the sidewall 304b from being etched. Therefore, the opening 310 with an upping wider profile is formed within the conductive layer 304a, as shown in FIG. 3C.

Figure 3D:
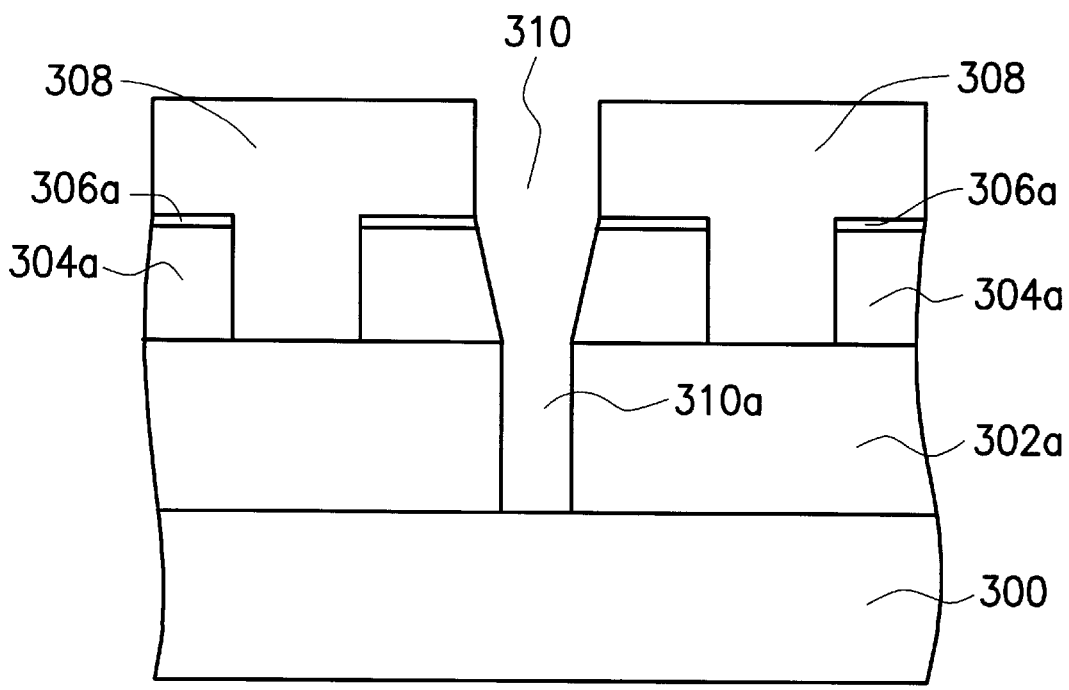

Referring to FIG. 3D, using the conductive layer 304a as a mask layer, the IPD 302a is etched away through the lower portion "w" of the opening 310 by anisotropic etching in the presence of the photoresist layer 308, so that a node contact window 310a is formed within the IPD 302a to expose the substrate 300. Since the photoresist layer 308 is not removed in the prior step, the IPD 302a between the region 307 of the capacitor is protected and the opening 310a is only formed within the pre-determined region for the node contact window 310a.

Figure 1:
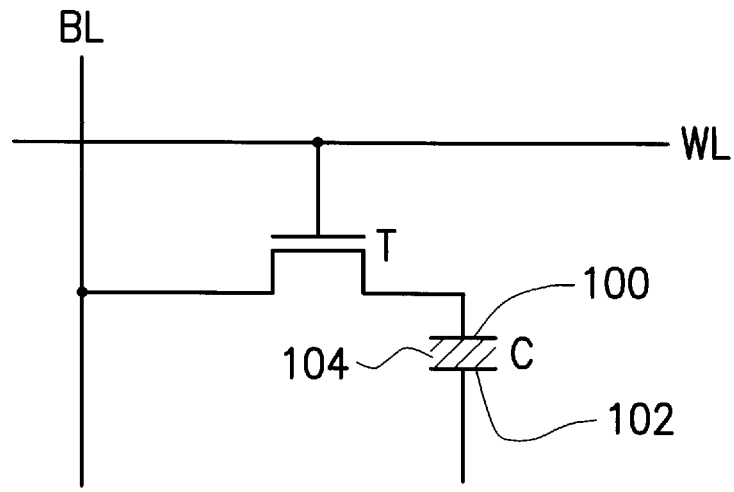
FIG. 1 shows the circuit diagram of a typical DRAM device.
Figure 2:
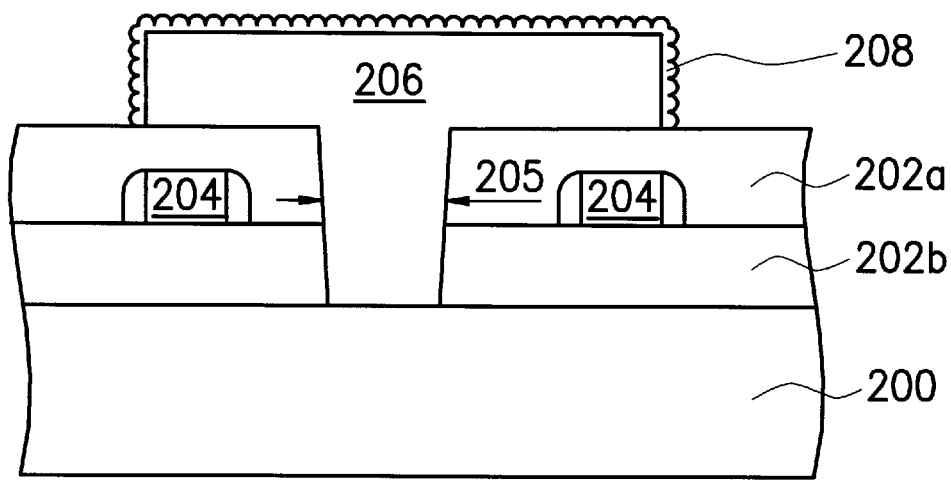
FIG. 2 is a schematic, cross-sectional view of DRAM capacitor as fabricated in prior art.
Figure 3E:
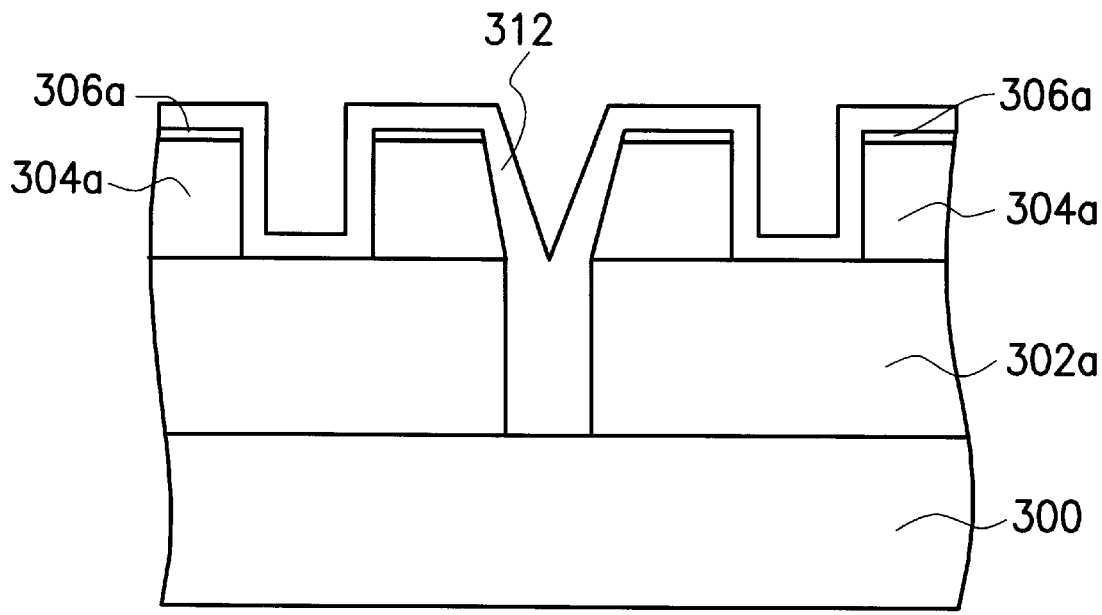

Referring to FIG. 3E, the photoresist layer 308 is stripped away. An amorphous silicon layer 312 is then formed over the substrate 300. The amorphous silicon layer 312 is covered the exposed IPD 302a and the conductive layer 304a, and further fills the opening 310 and the node contact window 310a of FIG. 3D to electrically couple with the substrate 300. The amorphous silicon layer 312 is formed by LPCVD with a source gas including $SiH_4$ at a reaction temperature of about 575° C. The silicon atoms of the amorphous silicon layer 312 adsorbed on a thin film have a poorer diffusion ability, such that the structure of the amorphous silicon layer 312 is no-long-range order. Because the deposited temperature of the amorphous silicon layer 312 is lower, it is necessary to spend much time to deposit a thicker amorphous silicon layer 206 as seen in FIG. 2 of prior art. The amorphous silicon layer 312 in this invention is thinner than that in prior art, so that time expenditure is lowered.

Figure 3F:
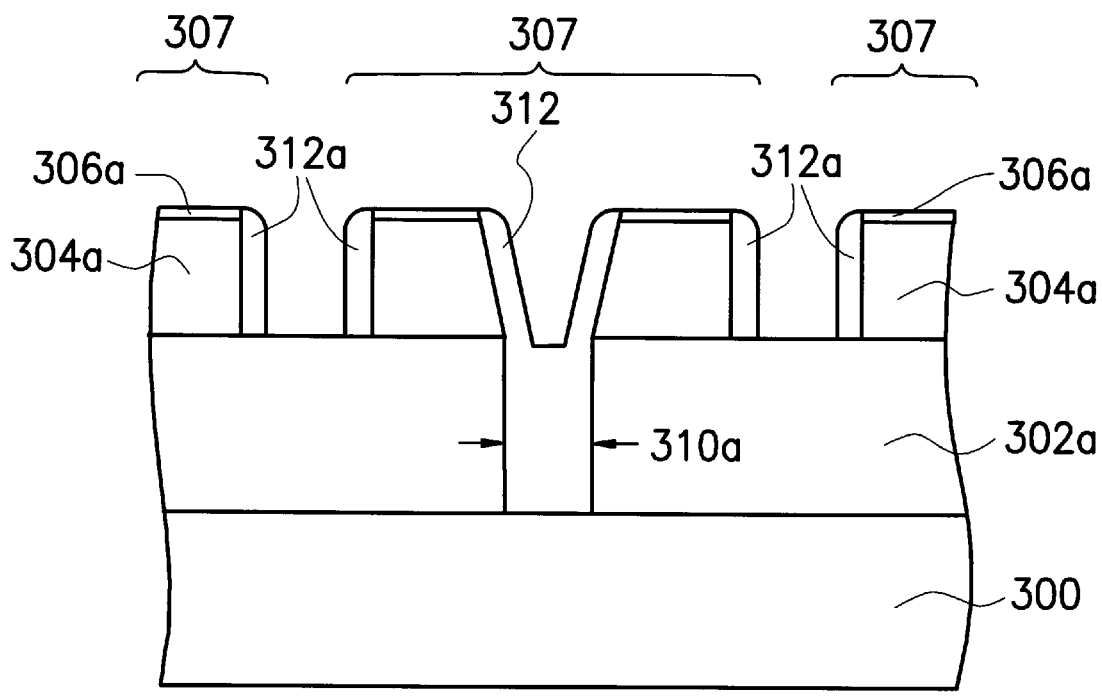

An etching back step is performed on the amorphous silicon layer 312 to define the region 307 of capacitor. A portion of the amorphous silicon layer 312 is removed while using the IPD 302a as a stop layer and an amorphous silicon spacer 312a, 312b is thus formed, as shown in FIG. 3F. A portion of the IPD 302a and the amorphous silicon layer 306a on the conductive layer 304a are exposed. A portion of the amorphous silicon layer 312b in the node contact window 310a is removed, but is not etched through to expose the substrate 300. Therefore, the region of the capacitor 307 can be defined and the amorphous silicon spacer 312b is electrically connected to the substrate 300.

Figure 3G:
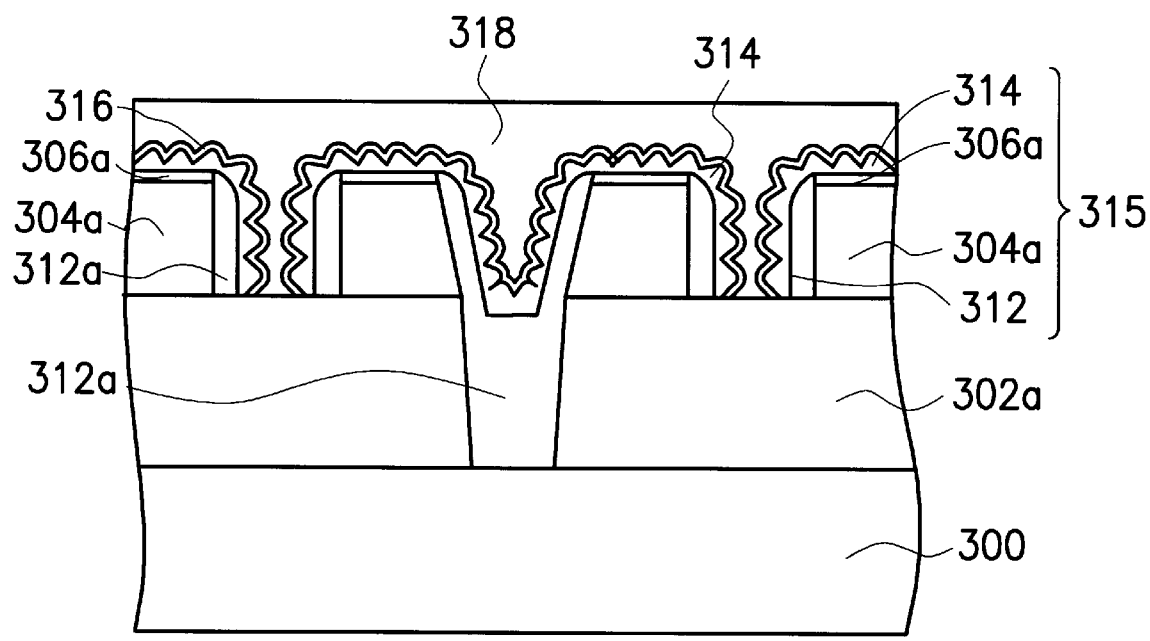

Referring to FIG. 3G, a selective HSG-Si 314 is formed selectively on the amorphous silicon layer 306a, 312a, 312b because of formation of amorphous silicon layer 306a, 312a, 312b. The HSG-Si 314, the amorphous silicon layer 306a, 312a, 312b and the conductive layer 304a serve as a lower electrode 315 of the capacitor and the surface area of the lower electrode 315 is increased by forming the HSG-Si 314 with a rough surface. A dielectric layer 316 and a conductive layer 318, such as a polysilicon layer, are formed successively on the lower electrode 315 and the conductive layer 318 serves as an upper electrode of the capacitor.

A conductive layer having an opening is formed on a dielectric layer and the conductive layer serves as a mask layer to form a node contact window within the dielectric layer. The opening has a profile with a wider upper portion and a narrower lower portion to increase the exposure range of the opening, so that the step of exposure is easily performed without limitation of depth of focus. Otherwise, because the lower portion of the opening is narrower, the width of the node contact window can thus be reduced without the restriction of the exposure light resolution. Since the width of the node contact window is reduced, the insulation distance between word lines, bit lines and node contacts are wider to prevent from the problem of misalignment.

In addition the desired amorphous silicon layer is thinner than that in prior art, and time needed to form the amorphous silicon layer can be decreased and the yield of product is hence increased.

Moreover, since a selective HSG-Si is formed on the amorphous silicon layer to serve as a portion of the lower electrode, the capacitance is therefore improved while the surface area is increased.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a DRAM capacitor wherein a substrate having word lines and bit lines is provided and the word lines are isolated with the bit lines by an inter-poly dielectric layer (IPD) formed on the substrate, comprising:

forming a first polysilicon layer and a first amorphous silicon layer over the inter-poly dielectric layer (IPD);

forming a region of the capacitor by patterning the first amorphous layer and the first polysilicon layer using a photoresist layer and a portion of the first polysilicon layer until the IPD is exposed;

forming an opening having wider upper portion and narrower lower portion within the first polysilicon layer to expose the IPD;

forming a node contact window within the IPD to expose the substrate through the opening while using the first polysilicon layer and the photoresist layer as mask;

removing the photoresist layer;

forming a second amorphous silicon layer to fill the node contact window and the opening;

defining the region of the capacitor by etching back the second amorphous silicon layer to expose the IPD while using the IPD as a stop layer, so that an amorphour silicon spacer is formed wherein a portion of the amorphous silicon spacer fills the node contact window and is electrically coupled to the substrate;

forming a selective HSG-Si over the substrate wherein the first polysilicon layer, the first amorphous silicon layer, the amorphous spacer and the selective HSG-Si serve as a lower electrode of the capacitor; and forming a dielectric layer and a second polysilicon layer on the selective HSG-Si wherein the second polysilicon layer serves as an upper electrode of the capacitor.

2. A method of fabricating a DRAM capacitor wherein a substrate has a first dielectric layer formed on the substrate, comprising:

forming a first conductive layer and a first amorphous silicon layer on the dielectric layer;

forming a region of the capacitor by patterning the first amorphous layer and the first conductive layer to expose a portion of the first dielectric layer;

forming an opening having a wider upper portion and a narrower lower portion within the first conductive layer to expose the first dielectric layer;

forming a node contact window to expose the substrate by patterning the first dielectric layer through the opening;

forming a second amorphous silicon layer on the capacitor region such that a portion of the second amorphous silicon layer fills the node contact window and is electrically coupled to the substrate, wherein the first conductive layer and the second amorphous silicon layer serve as a lower electrode of the capacitor; and forming a second dielectric layer and a second conductive layer on the lower electrode wherein the second conductive layer serves as an upper electrode of the capacitor.

3. The method according to claim 2, wherein after forming the lower electrode and before forming the second dielectric layer further comprises forming a selective HSG-Si on the first and the second amorphous silicon layers.

4. The method according to claim 2, wherein the first and the second conductive layers include a polysilicon layer 6.

5. The method according to claim 2, wherein forming a second amorphous silicon layer on the region of the capacitor further comprises forming a third amorphous silicon layer over the substrate; and etching back the third amorphous silicon layer to form the second amorphous silicon layer to cover the first conductive layer of the region of the capacitor and expose the first dielectric layer.

6. A method of fabricating a DRAM capacitor wherein a substrate has a first dielectric layer formed on the substrate, comprising:

forming a first conductive layer on the first dielectric layer;

forming a region of the capacitor by patterning the first conductive layer to expose a portion of the first dielectric layer;

forming an opening having a wider upper portion and a narrower lower portion within the first conductive layer to expose the first dielectric layer;

forming a node contact window in the first dielectric layer to expose the substrate by patterning the first dielectric layer through the opening;

forming an amorphous silicon layer on the sidewall of the conductive layer and filling the node contact window with the amorphous silicon layer to electrically couple the amorphous silicon layer to the substrate, wherein the first conductive layer and the amorphous silicon layer serve as a lower electrode of the capacitor; and forming a second dielectric layer and a second conductive layer on the lower electrode wherein the second conductive layer serves as an upper electrode of the capacitor.

7. A method of fabricating a node contact window, comprising:

providing a substrate having a dielectric layer thereon;

forming a conductive layer on the dielectric layer;

forming an amorphous silicon layer on the conductive layer;

forming a region of a capacitor by patterning the conductive layer and the amorphous silicon layer;

forming an opening having an wider upper profile within the conductive layer to expose the dielectric layer; and forming a node contact window within the dielectric layer by etching through the dielectric layer to expose the substrate.

8. The method according to claim 7, wherein the conductive layer includes a polysilicon layer.

* * * * *